US009746509B2

(12) United States Patent
Wu et al.

(10) Patent No.: US 9,746,509 B2
(45) Date of Patent: Aug. 29, 2017

(54) CIRCUIT TESTING METHOD AND CIRCUIT TESTING SYSTEM

(71) Applicant: BOE TECHNOLOGY GROUP CO., LTD., Beijing (CN)

(72) Inventors: Chunwei Wu, Beijing (CN); Woobong Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 302 days.

(21) Appl. No.: 14/416,530

(22) PCT Filed: Jul. 2, 2014

(86) PCT No.: PCT/CN2014/081487
§ 371 (c)(1),
(2) Date: Jan. 22, 2015

(87) PCT Pub. No.: WO2015/062302
PCT Pub. Date: May 7, 2015

(65) Prior Publication Data
US 2015/0355257 A1     Dec. 10, 2015

(30) Foreign Application Priority Data

Oct. 31, 2013     (CN) .......................... 2013 1 0532592

(51) Int. Cl.
*G01R 31/02*     (2006.01)
*G01R 27/26*     (2006.01)
(Continued)

(52) U.S. Cl.
CPC ........... *G01R 31/025* (2013.01); *G01R 27/26* (2013.01); *G01R 31/2829* (2013.01);
(Continued)

(58) Field of Classification Search
CPC ..... G01R 31/02; G01R 31/024; G01R 31/025
See application file for complete search history.

(56) References Cited

U.S. PATENT DOCUMENTS 8,519,722 B1 * 8/2013 Prendergast .......... G06F 3/0418
324/658
2012/0025855 A1     2/2012 Chang et al.
(Continued)

FOREIGN PATENT DOCUMENTS

CN         1667682 A      9/2005
CN       101329380 A     12/2008
(Continued)

OTHER PUBLICATIONS

International Search Report and Written Opinion mailed Oct. 10, 2014 regarding PCT/CN2014/081487. Translation provided by Dragon Intellectual Property Law Firm.
(Continued)

*Primary Examiner* — Kristal Feggins
*Assistant Examiner* — Kendrick Liu
(74) *Attorney, Agent, or Firm* — Harness, Dickey & Pierce, P.L.C.

(57) ABSTRACT

The present disclosure provides a circuit testing method and a circuit testing system for testing the circuit of a transmissive capacitive touch panel, wherein, the method comprises: when testing a certain induction line in a first electrode matrix or a second electrode matrix, configuring all induction lines in the first electrode matrix and the second electrode matrix except for the induction line to be tested as ground wires, applying a first voltage to the induction line to be tested, and detecting current on the induction line to be tested, and determining that the induction line to be tested is in a short-circuit state when the current is generated on the
(Continued)

induction line to be tested; repeating the above step, and testing other induction lines in turn.

6 Claims, 4 Drawing Sheets

(51) Int. Cl.
  *G09G 3/00* (2006.01)
  *G06F 3/044* (2006.01)
  *G06F 3/041* (2006.01)
  *G01R 31/28* (2006.01)
(52) U.S. Cl.
  CPC ............ *G06F 3/044* (2013.01); *G06F 3/0418* (2013.01); *G09G 3/006* (2013.01); *G01R 31/2812* (2013.01)

(56) References Cited

U.S. PATENT DOCUMENTS

2012/0293455 A1   11/2012   Shen et al.
2013/0320994 A1*  12/2013   Brittain .................. G06F 3/0416
                                                              324/537

FOREIGN PATENT DOCUMENTS

| | | |
|---|---|---|
| CN | 102809707 A | 12/2012 |
| CN | 203012068 U | 6/2013 |
| CN | 103529354 A | 1/2014 |
| JP | H03252566 A | 11/1991 |
| JP | 2011220916 A | 11/2011 |
| TW | 523595 B | 3/2003 |
| TW | 201142681 A | 12/2011 |

OTHER PUBLICATIONS

Chinese Office Action mailed Jun. 3, 2015 regarding Chinese Application No. 201310532592.7. Translation provided . . . by Dragon Intellectual Property Law Firm.

Second Office Action regarding Chinese application No. 201310532592.7, dated Nov. 10, 2015. Translation provided by Dragon Intellectual Property Law Firm.

* cited by examiner

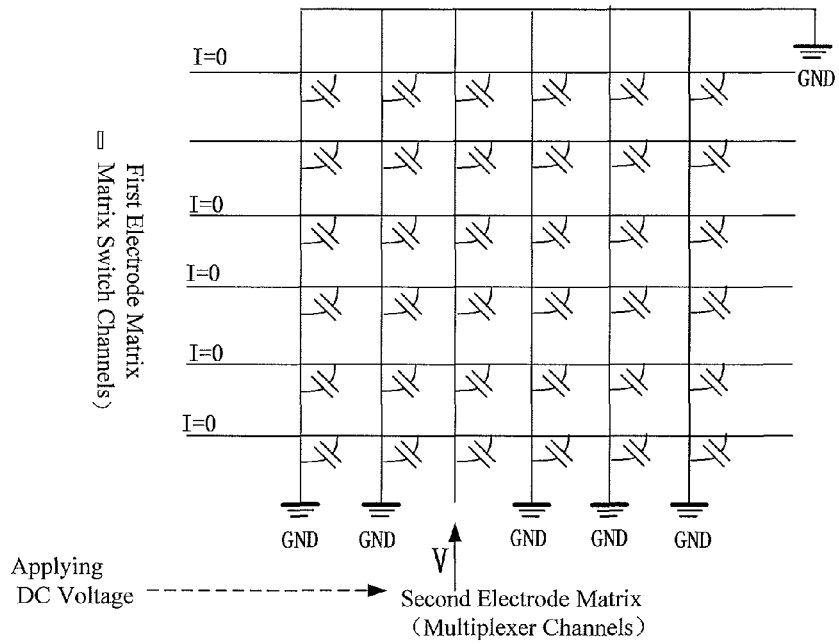

Prior Art

Fig. 2

| When testing a certain induction line in a first electrode matrix or a second electrode matrix, configuring all induction lines in the first electrode matrix and the second electrode matrix except for the induction line to be tested as ground wires, applying a first voltage to the induction line to be tested, and detecting current on the induction line to be tested, and determining that the induction line to be tested is in a short-circuit state when a current is generated on the induction line to be tested | 1 |

↓

| Repeating the Step 1, and testing other induction lines in the first electrode matrix and the second electrode matrix in turn | 2 |

Fig. 3

CIRCUIT TESTING METHOD AND CIRCUIT TESTING SYSTEM

CROSS-REFERENCE TO RELATED APPLICATION

This application is the U.S. national phase of PCT Application No. PCT/CN2014/081487 filed on Jul. 2, 2014, which claims priority to Chinese Patent Application No. 201310532592.7 filed on Oct. 31, 2013, the disclosures of which are incorporated in their entirety by reference herein.

TECHNICAL FIELD

The present disclosure relates to a circuit testing method and a circuit testing system, and in particular, to a circuit testing method and a circuit testing system for a capacitive touch panel.

BACKGROUND

Various capacitive touch panels on the market employ an open electric field structure, and capacitive touch panels are just manufactured by utilizing the principle that an open electric field is prone to be interfered externally. A capacitive projected touch panel is constructed by adding two sets of induction lines (X, Y), which exist in different planes and are vertical to each other, and drive wires, and because X, Y induction lines are constructed in different surfaces (or in the same surface but insulated at the crossings), capacitance nodes will be formed at the crossings thereof; when current passes through one of the induction lines via a drive wire, the other layer of induction lines will be connected with an electronic loop for detecting the variation of capacitance value. During operation, a controller successively supplies current to the drive wires in different layers, thus a specific electric field will be formed between each node and the induction lines, and when a finger or a touch media approaches, the controller rapidly detects the variation of capacitance value between the node and the induction line, thereby determining the touch location.

FIG. 1 is a schematic diagram of a transmissive capacitive touch panel, and FIG. 2 is a functional diagram of a transmissive capacitive touch panel. Generally, for determining whether the touch panel can work normally after being assembled into a module, it needs to test whether the resistance of each induction line in the two sets of induction lines set vertically on the capacitive touch panel is normal. As shown in FIG. 1 and FIG. 2, the following method may be used to test a capacitive touch panel in the prior art: connecting a shorting bar 10 to the end of the induction line, and obtaining the resistance and capacitance by measuring the head of the induction line and the shorting bar.

However, the method has the following defects, for example, a space needs to be reserved for manufacturing a shorting bar on the base substrate, thus, many spaces will be wasted on the base substrate, and the shorting bar needs to be cut off, and when short circuit occurs between the induction line to be measured and its adjacent induction lines, the resistance value measured by this method will still be normal, thus abnormal resistance cannot be sensed.

SUMMARY

An object of the present disclosure is to provide a circuit testing method and a circuit testing system, which may test each induction line on a capacitive touch panel in a simple way.

The disclosure has the following technical solutions:
A circuit testing method, for testing the circuit of a transmissive capacitive touch panel, comprising:
Step 1: when testing a certain induction line in a first electrode matrix or a second electrode matrix, configuring all induction lines in the first electrode matrix and the second electrode matrix except for the induction line to be tested as ground wires, applying a first voltage to the induction line to be tested, and detecting current on the induction line to be tested, and determining that the induction line to be tested is in a short-circuit state when the current is generated on the induction line to be tested;
Step 2: repeating the above Step 1, and testing other induction lines in the first electrode matrix and the second electrode matrix in turn.
Further, the first voltage is a DC voltage.
Optionally, the method further comprises:
Step 3: when testing a capacitance node formed by a first induction line in the first electrode matrix and a second induction line in the second electrode matrix,
configuring the first induction line as a ground wire, and applying a second voltage to other induction lines in the first electrode matrix except for the first induction line;
applying a third voltage to the second induction line, and configuring other induction lines in the second electrode matrix except for the second induction line as ground wires;
detecting the current on the first induction line, determining that the first induction line and the second induction line at the capacitance node to be tested are short-circuited when current is generated on the first induction line, and determining that the first induction line and the second induction line at the capacitance node to be tested are open-circuited when no current is generated on the first induction line;
Step 4: repeating the above Step 3, and in turn testing the capacitance nodes formed by other induction lines in the first electrode matrix and the second electrode matrix.
Further, the second voltage and the third voltage are both DC voltages, and the second voltage is the same as the third voltage.
A circuit testing system, for testing the circuit of a transmissive capacitive touch panel, comprising:
a first configuring module, for configuring all induction lines in the first electrode matrix and the second electrode matrix except for the induction line to be tested as ground wires when testing a certain induction line in a first electrode matrix or a second electrode matrix;
a second configuring module, for applying a first voltage to the induction line to be tested;
a first detecting module, for detecting the current on the induction line to be tested.
Further, the first voltage is a DC voltage.
Moreover, the system further includes:
a third configuring module, for configuring the first induction line as a ground wire when testing a capacitance node formed by a first induction line in the first electrode matrix and a second induction line in the second electrode matrix;
a fourth configuring module, for applying a second voltage to other induction lines in the first electrode matrix except for the first induction line;
a fifth configuring module, for applying a third voltage to the second induction line;

a sixth configuring module, for configuring other induction lines in the second electrode matrix except for the second induction line as ground wires; and a second detecting module, for detecting the current on the first induction line.

Further, the second voltage and the third voltage are both DC voltages, and the second voltage is the same as the third voltage.

The disclosure has the following beneficial effects:

In the method according to the disclosure, no space for manufacturing a shorting bar needs to be reserved on the base substrate of the touch panel, thus the space on the base substrate may be saved, and no operations such as cutting off a shorting bar are required, thereby the operation may be simple, the testing process may be simple, and the short-circuit status on each induction line in the capacitive touch panel may be tested.

BRIEF DESCRIPTION OF THE DRAWINGS

FIG. 2 is a schematic diagram showing the testing of a capacitive projected touch panel in the prior art;

FIG. 3 is a flow chart of a circuit testing method according to the disclosure;

DETAILED DESCRIPTION

The principles and characteristics of the disclosure will be described below in conjunction with the drawings, and the examples listed are only used to explain the disclosure, rather than limiting the scope of the disclosure.

As directed to problems of the prior art that, for the testing of a capacitive projected touch panel, a space needs to be wasted on the base substrate, a shorting bar needs to be cut off and the testing result is likely to be inaccurate, the disclosure provides a circuit testing method. The testing method is simple, a touch panel on which no space is reserved for a shorting bar may be tested, and each induction line may be tested for determining whether it is in a normal state, so that it may determine whether a touch panel can work normally after being assembled into a module.

Figure 1:
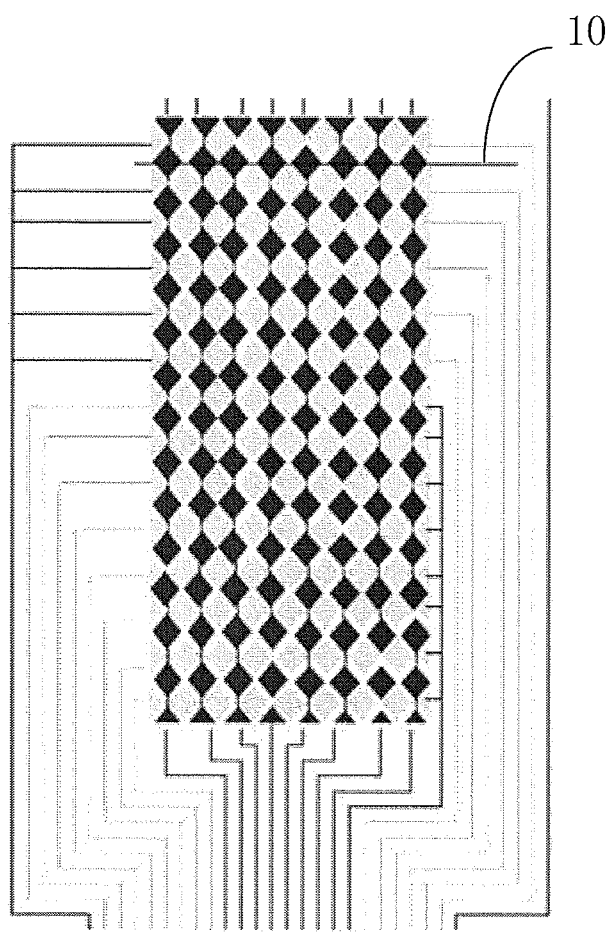
FIG. 1 is a schematic diagram of a capacitive projected touch panel.
Figure 4:
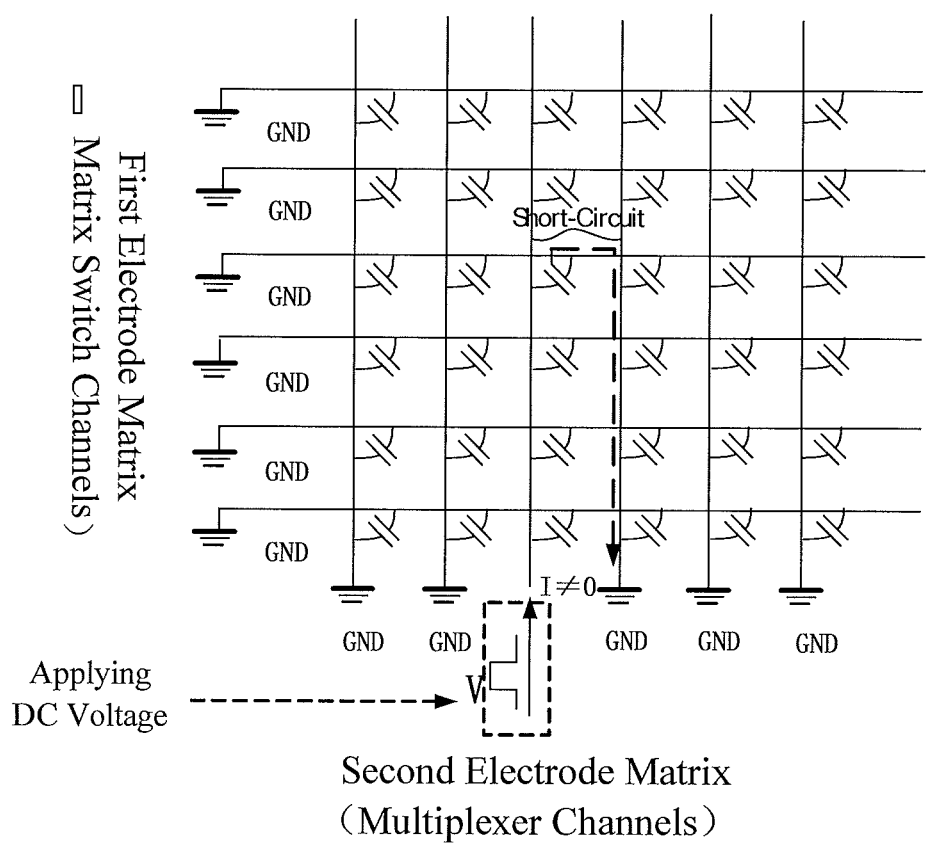
FIG. 4 is a schematic diagram showing Step 1, in which an induction line to be tested is short-circuited, of the circuit testing method according to the disclosure.
Figure 5:
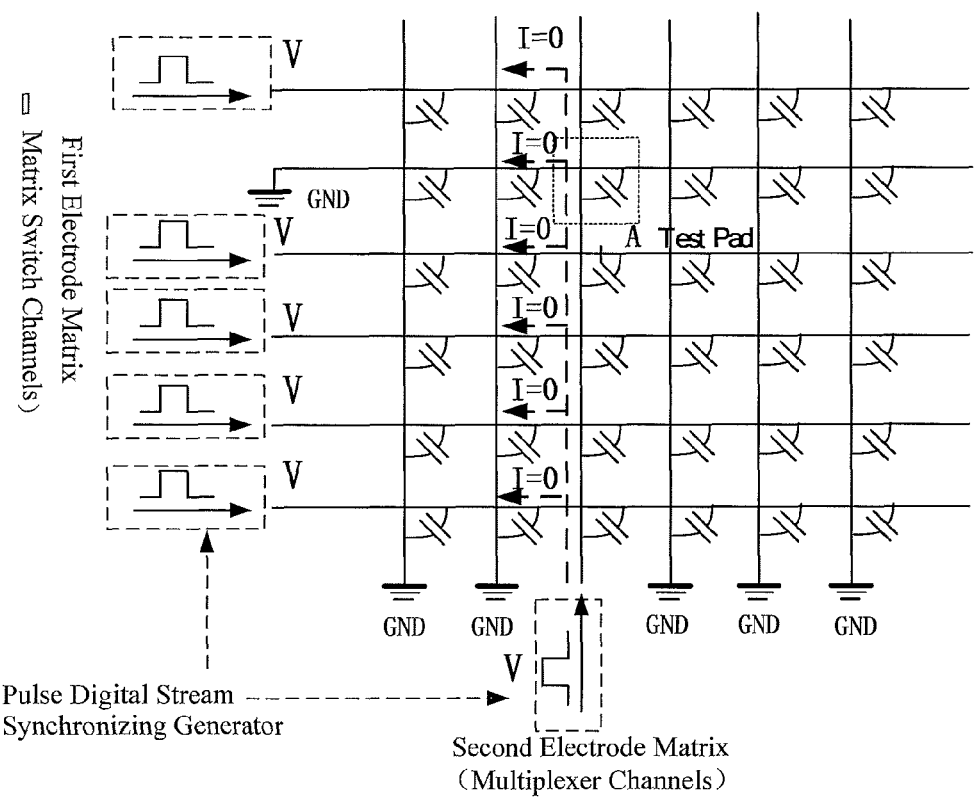
FIG. 5 is a schematic diagram showing Step 3, in which open circuit occurs at a capacitance node to be tested, of the circuit testing method according to the disclosure.

First of all, a capacitive projected touch panel will be illustrated below. As shown in FIG. 4 and FIG. 5, a capacitive projected touch panel usually includes a first electrode matrix (Matrix Switch Channels shown in FIG. 2 and FIG. 4s) and a second electrode matrix (Multiplexer Channels shown in FIG. 2 and FIG. 4), wherein, the first electrode matrix is consisted of several induction lines that are arranged laterally, the second electrode matrix is consisted of several induction lines that are arranged longitudinally, and capacitance nodes are formed at the crossings of the first electrode matrix and the second electrode matrix.

The circuit testing method according to the disclosure may realize a short test on each induction line in the first electrode matrix and the second electrode matrix.

Specifically, as shown in FIG. 3 and FIG. 4, the circuit testing method according to the disclosure includes:

Step 1: when testing a certain induction line in a first electrode matrix or a second electrode matrix, configuring all induction lines in the first electrode matrix and the second electrode matrix except for the induction line to be tested as ground wires, applying a first voltage to the induction line to be tested, and detecting the current on the induction line to be tested, and determining that the induction line to be tested is in a short-circuit state when current is generated on the induction line to be tested;

Step 2: repeating the above Step 1, and testing other induction lines in the first electrode matrix and the second electrode matrix in turn.

In the above solution, as shown in FIG. 4, by taking the third induction line in the second electrode matrix as a example, a ground signal is supplied to all induction lines except for the induction line to be tested, and a voltage signal is supplied to the induction line to be tested, and if current is generated on the induction line to be tested (as shown in FIG. 4, on the third induction line, I≠0), it will be determined that the induction line to be tested is short-circuited, and it may be tested whether the induction line is short-circuited by only measuring one end of the induction line to be tested.

Preferably, the first voltage is a DC voltage, that is, a DC signal is applied to the induction line to be tested.

In addition, in the circuit testing method according to the disclosure, capacitance nodes (test pads) formed at the crossings of the induction lines in the first electrode matrix and the induction lines of the second electrode matrix may also be tested, so as to test the open-shorted status at the crossings of the induction lines in the first electrode matrix and the induction lines of the second electrode matrix.

As shown in FIG. 5, the circuit testing method according to the disclosure may test a capacitance node in the steps below:

Step 3: when testing a capacitance node formed by a first induction line in the first electrode matrix and a second induction line in the second electrode matrix, configuring the first induction line as a ground wire, and applying a second voltage to other induction lines in the first electrode matrix except for the first induction line;

applying a third voltage to the second induction line, and configuring other induction lines in the second electrode matrix except for the second induction line as ground wires;

detecting the current on the first induction line, determining that the first induction line and the second induction line at the capacitance node to be tested are short-circuited when current is generated on the first induction line, and determining that the first induction line and the second induction line at the capacitance node to be tested are open-circuited when no current is generated on the first induction line;

Step 4: repeating the above Step 3, and in turn testing the capacitance nodes formed by other induction lines in the first electrode matrix and the second electrode matrix.

Preferably, the second voltage and the third voltage are both DC voltages, and the second voltage is the same as the third voltage.

By employing the above solution, it may determine whether the induction lines arranged laterally in the first electrode matrix and the induction lines arranged longitudinally in the second electrode matrix are short-circuited or open-circuited at the crossing. For example, for the test pad A in FIG. 5, a first induction line in the first electrode matrix and a second induction line in the second electrode matrix intersect at the test pad A. A ground signal is supplied to the first induction line in the first electrode matrix, and a DC voltage is supplied to other induction lines in the first electrode matrix; a DC voltage is also supplied to a second induction line in the second electrode matrix, and a ground signal is supplied to other induction lines in the second electrode matrix; thus, if current is detected on the first induction line, it will be determined that the first induction line and the second induction line at the test pad A are short-circuited, and if no current is detected on the first induction line, it will be determined that the first induction line and the second induction line at the test pad A are open-circuited.

It should be noted that, because the DC voltage applied to the second induction line is the same as the DC voltage applied on other induction lines in the first electrode matrix, it may guarantee that the measuring result on the test pad A will not be influenced no matter the induction lines in the second electrode matrix are short-circuited or open-circuited.

In addition, it should be noted that, by the circuit testing method according to the disclosure, not only a capacitive projected touch panel may be tested, but also a liquid crystal display (LCD) and an organic light-emitting diode (OLED) may be tested, for example, the open-shorted status between the gate line and the source-drain line may be tested, and so on.

In addition, the disclosure further provides a circuit testing system, for testing a capacitive touch panel, wherein the capacitive touch panel includes a first electrode matrix consisted of several induction lines that are arranged laterally and a second electrode matrix consisted of several induction lines that are arranged longitudinally, and a capacitance node is formed at the crossings of the induction lines in the first electrode matrix and the induction lines in the second electrode matrix, and the system includes:

a first configuring module, for configuring all induction lines in the first electrode matrix and the second electrode matrix except for the induction line to be tested as ground wires when testing a certain induction line in a first electrode matrix or a second electrode matrix, a second configuring module, for applying a first voltage to the induction line to be tested; and a first detecting module, for detecting the current on the induction line to be tested.

Further, the first voltage is a DC voltage.

Moreover, the system further includes:

a third configuring module, for configuring the first induction line as a ground wire when testing a capacitance node formed by a first induction line in the first electrode matrix and a second induction line in the second electrode matrix;

a fourth configuring module, for applying a second voltage to other induction lines in the first electrode matrix except for the first induction line;

a fifth configuring module, for applying a third voltage to the second induction line;

a sixth configuring module, for configuring other induction lines in the second electrode matrix except for the second induction line as ground wires; and a second detecting module, for detecting the current on the first induction line.

Further, the second voltage and the third voltage are both DC voltages, and the second voltage is the same as the third voltage.

The above descriptions show some illustrative embodiments of the disclosure. It should be pointed out that, for a person skilled in the art, various improvements and modifications may be made without departing from the principles of the disclosure.

What is claimed is:

1. A circuit testing method for testing the circuit of a transmissive capacitive touch panel, comprising:
    Step 1: when testing a certain induction line in a first electrode matrix or a second electrode matrix, configuring all induction lines in the first electrode matrix and the second electrode matrix except for the induction line to be tested as ground wires, applying a first voltage to the induction line to be tested, and detecting current on the induction line to be tested, and determining that the induction line to be tested is in a short-circuit state when the current is generated on the induction line to be tested;
    Step 2: repeating the Step 1, and testing other induction lines in the first electrode matrix and the second electrode matrix in turn;
    Step 3: when testing a capacitance node formed by a first induction line in the first electrode matrix and a second induction line in the second electrode matrix;
    configuring the first induction line as a ground wire, and applying a second voltage to the other induction lines in the first electrode matrix except for the first induction line;
    applying a third voltage to the second induction line, and configuring the other induction lines in the second electrode matrix except for the second induction line as ground wires; and
    detecting current on the first induction line, and determining that the first induction line and the second induction line at the capacitance node to be tested are short-circuited when the current is generated on the first induction line, and determining that the first induction line and the second induction line at the capacitance node to be tested are open-circuited when no current is generated on the first induction line; and
    Step 4: repeating the Step 3, and testing in turn the capacitance nodes formed by the other induction lines in the first electrode matrix and the second electrode matrix.

2. The circuit testing method according to claim 1, wherein the first voltage is a DC voltage.

3. The circuit testing method according to claim 1, wherein the second voltage and the third voltage are both DC voltages, and the second voltage is the same as the third voltage.

4. A circuit testing system, for testing a circuit of a transmissive capacitive touch panel, comprising:
    a first configuring module, for configuring all induction lines in a first electrode matrix and a second electrode matrix except for the induction line to be tested as ground wires when testing a certain induction line in a first electrode matrix or a second electrode matrix;
    a second configuring module, for applying a first voltage to the induction line to be tested;
    a first detecting module, for detecting current on the induction line to be tested;
    a third configuring module, for configuring a first induction line in the first electrode matrix as a ground wire when testing a capacitance node formed by the first induction line in the first electrode matrix and a second induction line in the second electrode matrix;
    a fourth configuring module, for applying a second voltage to the other induction lines in the first electrode matrix except for the first induction line;

a fifth configuring module, for applying a third voltage to the second induction line, a sixth configuring module, for configuring the other induction lines in the second electrode matrix except for the second induction line as ground wires; and a second detecting module, for detecting current on the first induction line.

5. The circuit testing system according to claim 4, wherein the first voltage is a DC voltage.

6. The circuit testing system according to claim 4, wherein the second voltage and the third voltage are both DC voltages, and the second voltage is the same as the third voltage.

\* \* \* \* \*